United States Patent
Souli et al.

(10) Patent No.: US 11,877,388 B2
(45) Date of Patent: Jan. 16, 2024

(54) COMPONENT CARRIER WITH EMBEDDED COMPONENT COVERED BY FUNCTIONAL FILM HAVING AN INHOMOGENEOUS THICKNESS DISTRIBUTION

(71) Applicant: AT&S Austria Technologie & Systemtechnik Aktiengesellschaft, Leoben (AT)

(72) Inventors: Imane Souli, Leoben (AT); Vanesa López Blanco, Coruña (ES); Erich Preiner, St. Michael in Obersteiermark (AT); Martin Schrei, Mogersdorf (AT)

(73) Assignee: AT&S Austria Technologie & Systemtechnik AG, Leoben (AT)

( * ) Notice: Subject to any disclaimer, the term of this patent is extended or adjusted under 35 U.S.C. 154(b) by 49 days.

(21) Appl. No.: 17/301,333

(22) Filed: Mar. 31, 2021

(65) Prior Publication Data
US 2021/0400803 A1    Dec. 23, 2021

(30) Foreign Application Priority Data

Jun. 22, 2020  (EP) ..................... 20181475

(51) Int. Cl.
H05K 1/02         (2006.01)
H05K 1/11         (2006.01)
(Continued)

(52) U.S. Cl.
CPC ......... *H05K 1/0271* (2013.01); *H05K 1/0204* (2013.01); *H05K 1/0224* (2013.01);
(Continued)

(58) Field of Classification Search
CPC .. H05K 1/0271; H05K 1/0204; H05K 1/0224; H05K 3/4664; H05K 3/467;
(Continued)

(56) References Cited

U.S. PATENT DOCUMENTS

| 6,400,573 B1 * | 6/2002 | Mowatt | H05K 1/117 361/764 |
| 2005/0017347 A1 * | 1/2005 | Morimoto | H05K 1/186 257/703 |

(Continued)

FOREIGN PATENT DOCUMENTS

| CN | 209471956 U | 10/2019 |
| EP | 3364456 A2 | 8/2018 |

(Continued)

OTHER PUBLICATIONS

Extended European Search report in Application No. 20181475.3; pp. 1-8; dated Jan. 14, 2021; European Patent Office, 80298, Munich, Germany.

*Primary Examiner* — Ishwarbhai B Patel
(74) *Attorney, Agent, or Firm* — Robert A. Blaha; SMITH TEMPEL BLAHA LLC

(57) ABSTRACT

A component carrier includes a stack having at least one electrically conductive layer structure and/or at least one electrically insulating layer structure, a component embedded in the stack, and a functional film covering at least part of the component and having an inhomogeneous thickness distribution over at least part of a surface of the component.

17 Claims, 2 Drawing Sheets

(51) Int. Cl.
*H05K 1/18* (2006.01)
*H05K 3/46* (2006.01)

(52) U.S. Cl.
CPC .......... *H05K 3/467* (2013.01); *H05K 3/4664* (2013.01); *H05K 1/11* (2013.01)

(58) Field of Classification Search
CPC . H05K 2201/0191; H05K 2201/09736; H05K 1/185
See application file for complete search history.

(56) References Cited

U.S. PATENT DOCUMENTS

| | | | |
|---|---|---|---|
| 2006/0261467 A1* | 11/2006 | Colgan | H01L 23/433 |
| | | | 257/E23.09 |
| 2017/0094797 A1* | 3/2017 | Baek | H05K 3/4697 |
| 2018/0168049 A1 | 6/2018 | Chen et al. | |
| 2018/0177045 A1* | 6/2018 | Schwarz | H05K 1/185 |
| 2019/0139848 A1* | 5/2019 | Abderrazzaq | H05K 1/144 |
| 2020/0243436 A1 | 7/2020 | Baftiri | |

FOREIGN PATENT DOCUMENTS

| | | |
|---|---|---|
| JP | S55124244 A | 9/1980 |
| KR | 20100107543 A | 10/2010 |

* cited by examiner

COMPONENT CARRIER WITH EMBEDDED COMPONENT COVERED BY FUNCTIONAL FILM HAVING AN INHOMOGENEOUS THICKNESS DISTRIBUTION

CROSS-REFERENCE TO RELATED APPLICATION

The present application claims the benefit of the filing date of the European Patent Application No. 20 181 475.3, filed Jun. 22, 2020, the disclosure of which is hereby incorporated herein by reference.

TECHNICAL FIELD

Embodiments of the invention relate to a component carrier. Furthermore, embodiments of the invention relate to a method of manufacturing a component carrier.

TECHNOLOGICAL BACKGROUND

In the context of growing product functionalities of component carriers equipped with one or more electronic components and increasing miniaturization of such components as well as a rising number of components to be mounted on the component carriers such as printed circuit boards, increasingly more powerful array-like components or packages having several components are being employed, which have a plurality of contacts or connections, with ever smaller spacing between these contacts. Removal of heat generated by such components and the component carrier itself during operation becomes an increasing issue. At the same time, component carriers shall be mechanically robust and electrically reliable so as to be operable even under harsh conditions.

A shortcoming with laminated component carriers is that they may be prone to warpage and/or other phenomena disturbing the performance and/or the reliability of the component carrier.

SUMMARY

There may be a need to provide a component carrier having a high performance and a high reliability.

According to an exemplary embodiment of the invention, a component carrier is provided, wherein the component carrier comprises a stack comprising at least one electrically conductive layer structure and/or at least one electrically insulating layer structure, a component embedded in the stack, and a functional film covering at least part of the component and having an inhomogeneous thickness distribution over at least part of a surface of the component.

According to another exemplary embodiment of the invention, a method of manufacturing a component carrier is provided, wherein the method comprises embedding a component in a stack comprising at least one electrically conductive layer structure and/or at least one electrically insulating layer structure, and coating at least part of a surface of the component with a functional film having an inhomogeneous thickness distribution.

OVERVIEW OF EMBODIMENTS

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In the context of the present application, the term "stack" may particularly denote an arrangement of multiple planar layer structures which are mounted in parallel on top of one another.

In the context of the present application, the term "layer structure" may particularly denote a continuous layer, a patterned layer or a plurality of non-consecutive islands within a common plane.

In the context of the present application, the term "component" may particularly denote an inlay-type member. Such a component may be arranged in an interior of the stack. A component may in particular have an electronic function and may thus be a heat source in view of ohmic losses. For instance, such a component may be a semiconductor die. Embedding the component may result in a component being completely buried within stack material. However, embedding the component in the stack may also be accomplished by inserting the component in a cavity in the stack so that the component still has surface contact.

In the context of the present application, the term "functional film" may particularly denote a thin layer structure covering at least part of the component and being configured so as to provide a specific function to the component carrier. In other words, the component carrier may be functionally extended when being provided with the functional film, which function is not available if the functional film is missing. Examples of the function are a prolongation of a lifetime of the component carrier of parts thereof, a reduction of the interior mechanically and/or thermal stress, a mechanical buffer function, etc.

In the context of the present application, the term "inhomogeneous thickness distribution" may particularly denote that the functional film has a varying thickness (for instance from zero or from a minimum value above zero up to a maximum thickness) on different surface portions of the component being covered by the functional film. Thus, the functional film may be provided not with a constant thickness, but in contrast to this with a thickness distribution, which may vary over the coated surface or surface portion.

According to an exemplary embodiment of the invention, a component carrier is provided, which has an embedded component (such as a semiconductor chip). In order to improve the overall properties of the component carrier with embedded component, a functional film with inhomogeneous thickness distribution may be applied to at least part of the surface of the embedded component which may thus be at least partially encapsulated with the functional film. Hence, not only the material of the functional film, but also a thickness distribution thereof may be used as design parameters for adjusting a function of a functional film in the framework of the component carrier with embedded component. By taking into account a thickness distribution of a functional film coating at least part of an embedded component, the freedom of design of a component carrier designer may be further increased by considering also the thickness distribution of a functional film as an adjustable parameter. For instance, the functional film may be provided with larger thickness in a surface portion of the component relating to a region of the component carrier being specifically prone to excessive heating, coefficient of thermal expansion (CTE) mismatch or bending stress. For example, when the component is a power chip, excessive heat may be created close to at least part of pads at which high current values are present. Consequently, it may be appropriate to provide the functional film with locally increased thickness in this region in a scenario in which the functional film contributes to heat removal and/or heat spreading in view of its high thermal conductivity. In another example, when specific portions of the component carrier close to the embedded component are prone to stress (for instance bending stress of a partially rigid and partially flexible component carrier or mechanical stress due to a locally pronounced CTE mismatch between component and component carrier stack material), a locally increased thickness of the functional film may cope with such issues as well.

In the following, further exemplary embodiments of the method and the component carrier will be explained.

In an embodiment, said functional film has a larger thickness on a top side and/or on a bottom side of the component as compared to at least part of side walls of the component. Top side and bottom side of a component embedded in a flat stack may be particularly prone to delamination tendencies or low adhesion issues. Thus, a thickness of the functional film may be larger on the top and/or bottom side of the component as compared to side surfaces. For example, the side surfaces may even be completely free of an adhesion promoting functional film. Thus, an inhomogeneous thickness distribution of the functional film may be selected to reflect spatial particularities of issues in an interior of the component carrier.

In an embodiment, said functional film is applied only on side walls of the component. For instance, only at least part of side walls may be selectively covered with the functional film. For example, electromagnetic shielding may be necessary and sufficient on side walls of an embedded component only, for instance when multiple components (emitting electromagnetic radiation and/or being sensitive with respect to electromagnetic radiation) are embedded side by side in an interior of the component carrier. In such a scenario, electromagnetic shielding only in a lateral direction may be sufficient or even necessary, for example when at least one embedded component requires a surface being not covered with electromagnetic radiation shielding material, since said surface is used for emitting or detecting electromagnetic radiation.

In an embodiment, said functional film is only applied on at least part of a top surface and/or a bottom surface of the component. Applying the functional film only on the top and/or bottom side, but not on side walls may allow to obtain a sufficient adhesion of the component within the stack without an increase of the dimensions of the component carrier by unneeded coverage of lateral surface portions of the component with a functional film.

In an embodiment, the functional film has a gradually or a continuously varying inhomogeneous thickness distribution over at least part of the surface of the component. This means that the functional film may have a varying thickness which changes continuously along a covered surface of the components, i.e., with a slope or curvature. An exposed surface of the functional film may for instance have a concave and/or convex shape. Such a gradual variation of thickness of the functional film on the component may allow to spatially adjust a degree or intensity of the function, for instance in terms of heat spreading.

In an embodiment, the functional film has a stepped or a discontinuous inhomogeneous thickness distribution over at least part of the surface of the component. In such embodiments, the functional film may be composed of a consecutive or continuous stepped structure (for instance shaped like part of a stair) and/or may comprise multiple separate island-type functional spots, for instance having vertical sidewalls.

In an embodiment, said functional film is made of a metal (such as copper), a metal alloy, and/or a ceramic (such as aluminum nitride (AlN)). When being coated with a metallic coating of non-constant thickness, in particular a copper coating, the component may be provided at least locally with electrically conductive, electromagnetic field shielding and/or heat removal structures of a metal or alloy. Using copper for the functional film also keeps the number of different materials within the component carrier small, since copper may be used for establishing electrically conductive layer structures of the stack in many cases anyway.

In an embodiment, said functional film is made of a resin, a plastic material or any polymer. Examples for usable polymers are polyetheretherketone (PEEK), polyamidoamine (PAMAM), polyether sulfone (PES), polyphenylene sulfide (PPS), polyethylene (PE), polytetrafluoroethylene (PTFE), acrylonitrile butadiene styrene (ABS), polyamide (PA), poly(methyl methacrylate) (PMMA), etc. Making the functional film out of a plastic or a polymeric material may, for instance, allow providing the component with surface portions having improved adhesion properties. It may also be possible that such a plastic material is made of a low Young modulus material having therefore soft material properties and thus providing the function of a mechanical buffer film for buffering mechanical load in an interior of the component carrier. In particular, the low Young modulus material of the functional film may have a value of the Young modulus below 10 GPa, in particular below 4 GPa. Such a low Young modulus material may also sup-press warpage.

In an embodiment, the thickness of said functional film is in a range from 50 nm to 5 μm, in particular in a range from 100 nm to 3 μm. Hence, already extremely small thicknesses of the functional film may be possible and sufficient for providing its function in the framework of the component carrier. For instance, such small thicknesses may be applied with low effort by sputtering. Such thin functional films may add a function to the component carrier without adding a noticeable additional volume to the component carrier.

In an embodiment, a ratio (D-d)/D (multiplied with 100%) between a difference between a largest thickness, D, and a smallest thickness, d, of the functional film on the one hand, and the largest thickness, D, on the other hand is at least 10%, in particular at least 30%. Hence, the inhomogeneity of the functional film on the surface of the component may vary by at least 10%, in particular by at least 30%, between a largest thickness and a smallest thickness. The mentioned pronounced thickness variations have turned out to be particularly appropriate for locally adjusting the function of the functional film and consequently of the component carrier with embedded component(s) as a whole. However, other embodiments may also have larger or smaller thickness variations of the functional film.

In an embodiment, said functional film is configured for providing the component carrier with at least one functionality which is spatially fine-tuned by said inhomogeneous thickness distribution. Such an additional functionality provided by the functional film may be a function of the component carrier, which the component carrier does not have without the functional film. The function itself may be provided by the material of the functional film, which may for instance be capable of removing heat, shielding electromagnetic radiation, mechanical buffering, etc. However, the extent or amount of the provided function may be fine-tuned by the inhomogeneous or non-constant thickness distribution of the functional film varying so as to modulate the additionally provided functionality over the surface of the component carrier.

In an embodiment, said functional layer is configured for promoting adhesion between the component and the stack. A laminated stack with embedded component, in particular when the embedded component is made of another material than the stack, may be prone to delamination due to poor adhesion. For instance, when the component is a semiconductor chip and the stack is an organic laminate including copper, undesired delamination may occur at an interface between component and stack. However, by interposing a functional film between component and stack, in particular on an upper and/or lower main surface thereof, the tendency of delamination may be significantly decreased, and the mutual adhesion between component and stack may be significantly improved.

In an embodiment, said functional film is configured for providing a fatigue protection to the component. A component carrier with embedded component may suffer fatigue, in particular when being used for a long time under harsh conditions. For instance, in the event of pronounced temperature cycles during long-term use of the component carrier, the lifetime of the component carrier with embedded component may have significantly limited. In the described embodiment, the functional film may be specifically adapted for prolonging the lifetime and suppressing material fatigue by adding a corresponding function to the component carrier. For instance, said function may be of such kind that the causes for the limited lifetime and the enhanced fatigue of material are defeated by the functional film. For instance, the functional film may be made of a low Young modulus material to serve as a mechanical buffer specifically at a sub-section of the embedded component where force peaks are present. This may be, for instance, a bending section of a partially rigid and partible flexible component carrier or a region of the component carrier where the local mismatch between coefficients of thermal expansion between stack material and component material is particularly pronounced.

In an embodiment, the inhomogeneous thickness distribution is asymmetric on at least one of a top surface of the component and a bottom surface of the component. The top surface and the bottom surface may be the surfaces of those sides of the component, which have the largest extensions. On the bottom surface, electrical contacts may be arranged. The top surface may be without electrical contacts. A distribution on a surface may be asymmetric, if it does not exhibit the same symmetries as the surface, e.g., mirror symmetries and/or rotational symmetries of the surface. The asymmetric distribution may result from slanted or directional deposition of the functional film such as sputtering at a slanted angle. The slanted angle may be an angle between 5 and 85 degrees with respect to the surface, in particular between 10 and 80 degrees, in particular between 20 and 70 degrees. The asymmetric distribution may be useful for spatially and directionally finetuning the functional film.

In an embodiment, a largest thickness of the inhomogeneous distribution is outside a center of a top surface and/or outside a center of a bottom surface of the component. The largest thickness may be an overall largest thickness of the inhomogeneous distribution or may only refer to the largest thickness on the respective surface. The center may be the center point of the respective surface, e.g., the center of gravity of that surface. Alternatively, the center may refer to a central region of the respective surface, e.g., of the same outline as the surface but having only a fourth of the area of the surface. A distribution with a largest thickness outside the center of a surface may result from slanted deposition of the functional film such as slanted sputtering. It may be advantageous for spatially and directionally finetuning the functional film.

In an embodiment, the inhomogeneous distribution extends from at least one sidewall of the component to at least one of a top surface and a bottom surface of the component, the inhomogeneous distribution having a largest thickness next to an edge of the component. The edge may be located where the at least one sidewall meets the top surface and/or the bottom surface. The functional film may be formed on at most two side walls and/or on only one of the bottom surface and the top surface. Such a distribution of a functional film may result from slanted deposition of the functional film such as slanted sputtering. It may be advantageous for spatially and directionally finetuning the functional film.

In an embodiment, a center of gravity of the inhomogeneous thickness distribution is located outside a central axis of the component. The central axis may refer to a central axis of the top surface and/or of the bottom surface of the component. The central axis may be perpendicular to the respective surface and/or pass through the center of gravity of that surface. Such an embodiment may result from slanted deposition of the functional film such as slanted sputtering. It may be advantageous for spatially and directionally finetuning the functional film.

In an embodiment, said functional film is configured for reducing a CTE (coefficient of thermal expansion) mismatch between the component and the stack. When the coefficients of thermal expansion of material of the component (for instance, silicon) and material of the stack (in particular, copper and prepreg) differ significantly, pronounced temperature changes may result in significantly different thermal expansions of component and stack. This may create, in turn, undesired internal stress due to the non-matching CTE values. By bridging a material of the inhomogeneously thick functional film between component and stack in such critical regions may allow to highly selectively reduce the CTE mismatch and may thereby improve reliability of the component carrier.

In an embodiment, said functional film is configured for distributing stress within the component carrier. When stress peaks occur in an interior of the component carrier, for instance thermal stress or mechanical bending stress, specifically critical stress peak regions may be provided with a locally thickened functional film in order to better distribute the stress over the entire volume of the component carrier.

In an embodiment, said functional film is configured for removing heat and/or spreading heat generated at the component (for instance when the latter is embodied as a semiconductor power chip). In the event of hot spots in an interior of a component carrier with embedded component, in particular at regions of the component in which excessive heat is generated during operation, the functional film with inhomogeneous thickness distribution may be provided with locally higher thickness specifically in one or more hot spot regions. For instance, one surface of a power semiconductor chip may be particularly prone to the generation of excessive heat. When the functional film locally provides increased thickness at one or more of such hot spots, the heat removal or heat spreading properties may be selectively improved. As a result, reliability of the component carrier may be increased.

In an embodiment, said functional film is configured for shielding electromagnetic radiation (in particular high-frequency radiation in a frequency range from 20 kHz to 300 GHz) between a further component embedded in the stack and the component and/or between an exterior of the component carrier and the component. In particular, in terms of high frequency applications, the functionality of an embedded high frequency chip may be significantly deteriorated by undesired interaction with electromagnetic radiation from the environment. Moreover, it may also happen that a high frequency chip, as another example for the embedded component, emits electromagnetic radiation, which may disturb other portions of the component carrier or an electronic periphery thereof. In both scenarios, shielding at least part of such an embedded component with regard to the propagation of electromagnetic radiation apparatuses, in particular RF radiation apparatuses, may be highly advantageous. In particular in the event of a spatially asymmetric electromagnetic radiation behavior, for instance when the embedded component emits electromagnetic radiation only in a defined direction or within a defined angular range, coverage of a corresponding part of the component with an electromagnetic radiation shielding functional film may be sufficient. Thus, the spatial inhomogeneity of the thickness of the functional film may be advantageously applied also to such a scenario, so that a proper electromagnetic radiation shielding may be combined with a compact configuration of a component carrier.

In an embodiment, the component carrier comprises at least one further functional film covering another surface portion of the component, wherein said functional film and said at least one further functional film provide different functions. In such embodiments, different surface portions of the component may be coated with different functional films of different materials to provide at least two different functions. Hence, performance and/or reliability of the component carrier may be further refined when different surface portions of the components are equipped with different functional films, for instance having different materials and optionally having different inhomogeneous thickness distributions. For example, one surface portion may be functionalized for improving adhesion with stack material by a first functional film, whereas another surface portion may be functionalized with a second functional film for promoting heat removal.

In an embodiment, the functional film with the inhomogeneous thickness distribution may be made of a low loss material having low loss for high frequencies. In particular, the low loss material (which may be a low dk material) may have a loss factor (which may also be denoted as dissipation factor) of not more than 0.004 at a frequency of 1 GHz. The functional film may thus comprise a high-frequency dielectric. In the context of the present application, the term "high-frequency dielectric" may particularly denote an electrically insulating material which has low loss properties when a high-frequency or radiofrequency signal propagates along and/or in the component carrier in the direct environment of the high-frequency dielectric. In particular, the high-frequency dielectric may have a lower loss than standard prepreg material of a stack of component carrier material. As an example, RO3003™ material, as commercialized by the company Rogers Corporation, can be used as high-frequency dielectric. For instance, high-frequency dielectric material may have a dissipation factor of not more than 0.004, in particular of not more than 0.003, more particularly not more than 0.0015, at 10 GHz. The mentioned high frequency circuit materials may be for example ceramic-filled PTFE (polytetrafluoroethylene) composites. By providing the functional film of a high-frequency dielectric, a low loss transport of even high-frequency signals is enabled. It is also possible that the high-frequency dielectric is a high-frequency capable prepreg, FR4 or ABF® material. ABF® is a registered mark of the Ajinomoto Co., Inc. of Tokyo, Japan. Such a high-frequency dielectric material may have a relative permeability, $\varepsilon_r$, in a range between 1.01 and 4.

In an embodiment, the method comprises forming said functional film by at least one of the group consisting of physical vapor deposition, chemical vapor deposition, atomic layer deposition, and plasma spraying. More specifically, the functional film may be formed for example by physical vapor deposition (PVD, e.g., by sputtering or RF sputtering), chemical vapor deposition (CVD, e.g., plasma enhanced CVD or metalloorganic CVD), atomic layer deposition (ALD) and/or plasma spraying. Depending on the size and geometry of the component, spray- and tip-coating is possible as well in order to apply the functional film. RF sputtering is in particular advantageous if polymers shall be deposited onto a surface. ALD may be preferably used to deposit very thin films. Furthermore, plasma spraying may be used to apply rather thick films with increased thickness distribution (and it involves only small manufacturing effort).

In the context of the present application, the term "sputtering" may particularly denote a coating method in which microscopic particles of a solid material are ejected from its surface, after the material is itself bombarded by energetic particles of a plasma or gas. The ejected particles form the coating material for the component, i.e., the functional film.

In the context of the present application, the term "physical vapor deposition" or PVD may particularly denote a coating method used to produce a metal vapor that can be deposited on the component as a thin, highly adhered pure metal or alloy coating forming the functional film. A PVD process may be carried out in a vacuum chamber at high vacuum using a cathodic arc source.

In the context of the present application, the term "chemical vapor deposition" or CVD may particularly denote a vacuum deposition method used to produce high quality, high-performance, solid materials. A CVD process may be used to produce a thin film constituting the functional film.

In the context of the present application, the term "atomic layer deposition" or ALD may particularly denote a thin-film deposition technique based on the sequential use of a gas phase chemical process. ALD may be considered as a subclass of chemical vapor deposition. ALD reactions may use at least two chemicals called precursors reactants for creating the functional film.

However, other methods of depositing spatially inhomogeneously thick functional films on at least part of a surface of an embedded component may be applied as well.

In an embodiment, the method comprises bombarding the component with particles for forming the functional film in a directional way (in particular spatially anisotropically) to thereby achieve said inhomogeneous thickness distribution. For instance, such a directed coating may be accomplished by supplying said bombarding particles at a slanted angle (for instance of at least 10°, in particular of at least 20°) with respect to main surfaces of the component. Highly advantageously, a directed bombardment of the component surface with particles forming the functional film may be an appropriate way of forming the functional film with varying thickness on different surface portions of the component. For instance, shadowing effects may be used for this purpose.

In an embodiment, the method comprises covering at least part of a surface of the component by a (temporary or permanent) protection structure during the coating for disabling formation of the functional film on the covered surface of the component. Such a protection structure (for instance a tape) may be attached to cover a surface portion of the component which shall not be coated with the functional film. After formation of the functional film, the protection structure may or may not be removed from the component. By taking this measurement, the surface portions of the component being covered or remaining uncovered with a functional film may be precisely defined. Hence, it is also possible to cover at least part of the component with a protection structure during formation of the functional film with inhomogeneous thickness. For instance, coating may be accomplished when the component has already been attached to at least part of the stack with one surface portion. Exposing the rest of the component to the material for forming the functional film may then result in an inhomogeneous thickness distribution as well.

In an embodiment, the method comprises removing, in particular by patterning, part of the functional film from at least part of a surface of the component to thereby create the inhomogeneity of the thickness. For instance, an inhomogeneous thickness distribution may be obtained by anisotropically etching of a previously deposited functional film of constant thickness.

In an embodiment, the method comprises coating the component outside of the stack. Such an embodiment has the advantage that the entire surface of the component is available for coating with the functional film prior to embedding.

In another embodiment, the method comprises coating the component after insertion of the component in the stack. In such an embodiment, stack material itself may protect selected surface portions of the component from being coated with the functional film. In other words, stack material may serve as the above-described protection structure.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through holes through the laminate, for instance by laser drilling or mechanical drilling, and by filling them with electrically conductive material (in particular copper), thereby forming vias as through hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier. A substrate may be a, in relation to a PCB, comparably small component carrier onto which one or more components may be mounted and that may act as a connection medium between one or more chip(s) and a further PCB. For instance, a substrate may have substantially the same size as a component (in particular an electronic component) to be mounted thereon (for instance, in case of a Chip Scale Package (CSP)). More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical, thermal and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) or a photo-imageable or dry-etchable organic material like epoxy-based build-up material (such as epoxy-based build-up film) or polymer compounds like polyimide, polybenzoxazole, or benzocyclobutene-functionalized polymers.

In an embodiment, the at least one electrically insulating layer structure comprises at least one of the group consisting of resin (such as rein-forced or non-reinforced resins, for instance epoxy resin or bismaleimide-triazine resin), cyanate ester resin, polyphenylene derivate, glass (in particular glass fibers, multi-layer glass, glass-like materials), prepreg material (such as FR-4 or FR-5), polyimide, polyamide, liquid crystal polymer (LCP), epoxy-based build-up film, polytetrafluoroethylene (PTFE,) Teflon®), a ceramic, and a metal oxide. Teflon is a registered mark of The Chemours Company FC LLC of Wilmington, Delaware, U.S.A. Reinforcing structures such as webs, fibers or spheres, for example made of glass (multilayer glass) may be used as well. Although prepreg particularly FR4 are usually preferred for rigid PCBs, other materials in particular epoxy-based build-up film or photo-imageable dielectric material may be used as well. For high frequency applications, high-frequency materials such as polytetrafluoroethylene, liquid crystal polymer and/or cyanate ester resins, low temperature cofired ceramics (LTCC) or other low, very low or ultra-low DK materials may be implemented in the component carrier as electrically insulating layer structure.

In an embodiment, the at least one electrically conductive layer structure comprises at least one of the group consisting of copper, aluminum, nickel, silver, gold, palladium, and tungsten. Although copper is usually preferred, other materials or coated versions thereof are possible as well, in particular coated with supra-conductive material such as graphene.

At least one component, which can be embedded in the stack, can be selected from a group consisting of an electrically non-conductive inlay (such as, a ceramic inlay, preferably comprising aluminum nitride (AlN)), an electrically conductive inlay (such as, a metal inlay, preferably comprising copper or aluminum), a heat transfer unit (for example, a heat pipe), a light guiding element (for example, an optical waveguide or a light conductor connection), an optical element (for instance, a lens), an electronic component, or combinations thereof. For example, the component can be an active electronic component, a passive electronic component, an electronic chip, a storage device (for instance, a DRAM or another data memory), a filter, an integrated circuit, a signal processing component, a power management component, an optoelectronic interface element, a light emitting diode, a photocoupler, a voltage converter (for example, a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a substrate, an interposer or a further component carrier, for example in a board-in-board configuration. The component may be surface mounted on the component carrier and/or may be embedded in an interior thereof. Moreover, also other components, may be used as component.

In an embodiment, the component carrier is a laminate-type component carrier. In such an embodiment, the component carrier is a compound of multiple layer structures which are stacked and connected together by applying a pressing force and/or heat.

After processing interior layer structures of the component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained.

After having completed formation of a stack of electrically insulating layer structures and electrically conductive layer structures, it is possible to proceed with a surface treatment of the obtained layers structures or component carrier.

In particular, an electrically insulating solder resist may be applied to one or both opposing main surfaces of the layer stack or component carrier in terms of surface treatment. For instance, it is possible to form such as solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are Organic Solderability Preservative (OSP), Electroless Nickel Immersion Gold (ENIG), gold (in particular Hard Gold), chemical tin, nickel-gold, nickel-palladium, Electroless Nickel Immersion Palladium Immersion Gold (ENIPIG), etc.

The aspects defined above and further aspects of the invention are apparent from the examples of embodiment to be described hereinafter and are explained with reference to these examples of embodiment.

DETAILED DESCRIPTION OF ILLUSTRATED EMBODIMENTS

Figure 1:
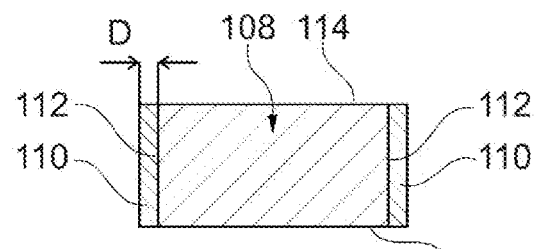
FIG. 1, FIG. 2 and FIG. 3 illustrate cross-sectional views of structures obtained during carrying out a method of manufacturing a component carrier according to an exemplary embodiment of the invention.

The illustrations in the drawings are schematically presented. In different drawings, similar or identical elements are provided with the same reference signs.

Before, referring to the drawings, exemplary embodiments will be described in further detail, some basic considerations will be summarized based on which exemplary embodiments of the invention have been developed.

According to an exemplary embodiment of the invention, a component to be embedded in a layer stack of a component carrier is provided with a functional film having an inhomogeneous thickness distribution on the component surface. For instance, a corresponding component carrier may be manufactured by a sputter-deposition of a thin functional film on a component (such as an inlay). For example, this may be accomplished for promoting adhesion and/or for improving the mechanical behavior of the component carrier with embedded component(s).

According to an exemplary embodiment of the invention, a functional film with inhomogeneous thickness over a surface of a component to be embedded in a component carrier may be provided for fine-tuning the functional properties of the component carriers. Preferably, this may be accomplished not only by a selection of a material of the functional film, but also by taking into account the thickness distribution of the functional film as an additional design parameter. As a result, a highly refined adjustment of the properties of the functional film may be obtained as compared to a homogeneous coating of a component with a coating layer having spatially constant thickness over the entire component.

The functional film may, for instance, be a monolithic or multilayer film. Such a functional film may, for example, be formed by sputtering for properly adjusting the thickness of the functional film. For instance, thickness may be adjusted in a range from 50 nm to 5 μm, preferably in a range from 100 nm to 3 μm. With still smaller thicknesses, the effect of the functional film with inhomogeneous thickness distribution may become small. With larger thicknesses, constraints of sputtering may have to be considered, and a long formation time for forming the functional layer may be involved.

According to a preferred embodiment, it may be possible to adjust grain size of the material of the functional film. For instance, the functional film may be made of a nanocrystalline, polycrystalline or amorphous material. For instance, the pressure of an argon flow or an electric voltage of a substrate and/or a target during sputtering may be parameters used for adjusting grain size. Adjusting grain size may, for instance, be advantageous for improving adhesion, since a larger surface area may result in a better adhesion with stack material.

One or more properties of the functional film may be adjusted in terms of its functionality and in terms of the functionality of the entire component carrier. For instance, a functional film may be formed as intermediate layer for stress distribution in the event of thermal expansion. A metallic function-al film may, for instance, be used for this purpose. Another goal may be to increase adhesion between embedded component (for instance a semiconductor chip) and an organic stack provided with copper. In order to achieve this goal, an applied functional film may be treated by plasma etching. Descriptively speaking, an increased roughness or surface profile may be obtained, for example when forming the functional film of a metallic material. The surface roughness of such a metallic functional film may be adjusted to be in a range from 15 nm to 30 nm.

In yet another embodiment, the characteristics of the functional film may be adjusted for suppressing fatigue of the component carrier and in particular the embedded component thereof. Material fatigue may be a phenomenon observed when using the component carrier with embedded component for a long term under harsh conditions. This may result in a deterioration of the component due to continuous application of thermal load. For instance, by providing a CTE (coefficient of thermal expansion) adaptation function, a functional film with inhomogeneous thickness distribution between component and stack may be advantageous.

For implementing a heat spreading function in the component carrier, a functional film with inhomogeneous thickness distribution with locally thickened copper sections may be provided.

For RF (radio-frequency) shielding, a functional film may be made of a metallic or even magnetic material and may be selectively applied or selectively applied with locally higher thickness on surface portions of the component being sensitive to radio frequency distortion.

Furthermore, the functional film may be configured for reducing the risk of chip cracking. For instance, a soft polymeric functional film, which is locally thickened in regions of excessive mechanical load may be used to overcome such issues.

For example, an inhomogeneous thickness distribution of the functional film may be obtained by placing the component (such as a semiconductor chip) on a carrier (such as a tape) during carrying out the process of forming the functional film, for instance by sputtering. A surface portion of the component attached to such a support may then be protected from being covered by the functional film, which may promote the generation of a functional film with inhomogeneous thickness distribution. Additionally or alternatively, a thickness distribution of the thin film type functional film may also be promoted with a directed bombardment with particles onto the various surface portions of the component during forming the functional film. For instance, such particles may be supplied at an angled direction with respect to a main surface of the component. A corresponding shadowing effect may then form a functional film on the component with varying thickness.

According to an exemplary embodiment of the invention, a sputter deposition of a thin functional film on inlays or other kinds of components may be provided for adjusting the functional properties of the component carrier. In particular, such a functional improvement may involve an ap-proved adhesion and an improved mechanical behavior.

Main challenges when embedding inlays (such as copper blocks) or electronic components (for instance semiconductor chips, or boards such as a smaller component carrier) in a stack are, for the component carrier system (in particular comprising core, inlay and adhesive resin), to ensure adhesion and to withstand stress during and after production and within cycling thermomechanical loads over its full operational lifetime. Depending on the buildup, the dimensions and thermomechanical behavior of constitutive materials of the core (in particular the main board), inlay and adhesive resin, several failure mechanisms may occur. Such errors involve component crack, delamination, etc.

In order to at least partially overcome these and/or other issues, an exemplary embodiment of the invention promotes adhesion between the component and the stack, in which it is embedded, to reduce fatigue and increase the lifetime of the component carrier. This may be obtained by a three-dimensional sputter deposition of a thin functional film with inhomogeneous thickness, so that a functional film with desired physical properties may be customized. For instance, surface portions of the component carrier, which are in contact with the main board and specifically suffer from one or more undesired phenomena, may be selectively covered with the functional film.

Furthermore, using sputter deposition may allow changing the growth conditions (in particular, kinetic and thermal input) that result in material properties of the functional film. Thus, it may be possible to support any requested thin film structure and physical properties. More specifically, an exemplary embodiment of the invention provides sputter deposition of a ductile thin functional film on an already prepared component, which functional film, depending on the application, allows an improved adhesion with the stack of the component carrier. Furthermore, this may allow to adapt the coefficient of thermal expansion (CTE) and/or may depress micro crack nucleation and propagation.

A method according to an exemplary embodiment of the invention is based on sputter deposition of a thin monolayer or multilayer thin functional film. For instance, such a functional film may be made of an inorganic material, for instance, aluminum oxide, copper, silver, graphene, etc. It is also possible to make the functional film of an organic material (for instance of an epoxy material). Also, a combination between electrically conductive and electrically insulating materials for the functional film may be possible. This may depend on a desired application of a manufactured component carrier. A functional film may be applied to at least a portion of an exposed surface of a component.

At the point of time of forming the functional film, the component may not yet be embedded in the stack or may be already attached to the stack.

Film sputtering can be achieved in one or several subsequent steps or stages. Subsequently, an inlay assembly and a lamination process can be carried out in a press, so that the one or more components may be embedded under high pressure and/or by providing high temperature.

A gist of an exemplary embodiment of the invention is the addition of characteristics to a component to be embedded to improve the performance of the entire component carrier in terms of reliability, chemical and physical (in particular thermal, electric, magnetic) properties and fatigue lifetime. In particular, adhesion of an inlay to a main board may be improved. Stress crack nucleation may be depressed or at least retarded. Furthermore, a CTE adaptation of the inlay(s) to the main board may be possible. Advantageously, it may be possible to control the process and the properties of the deposited thin film with high precision.

Figure 2:
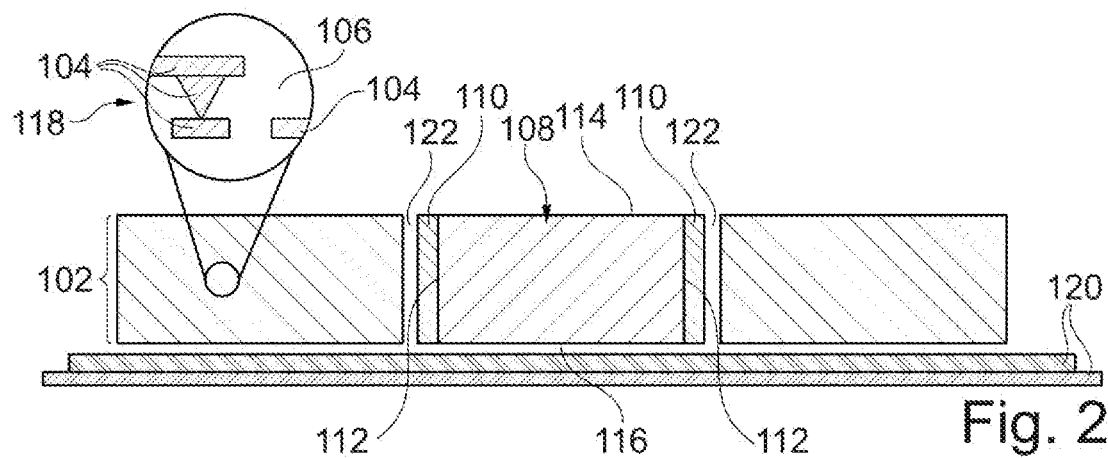
Figure 3:
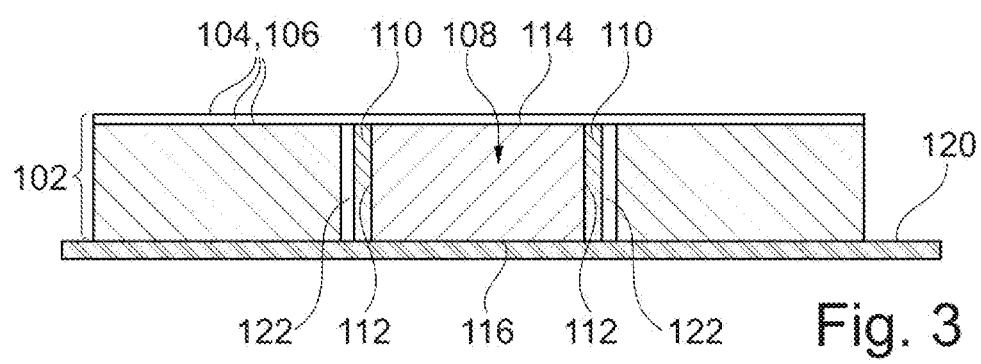
Figure 4:
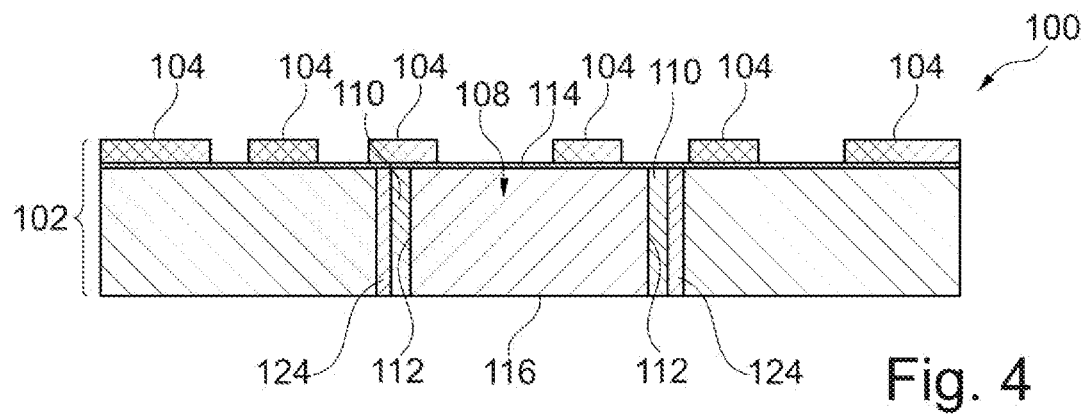
FIG. 4 illustrates a cross-sectional view of a component carrier according to an exemplary embodiment of the invention.

FIG. 1 to FIG. 4 illustrate cross-sectional views of structures obtained during carrying out a method of manufacturing a component carrier 100, shown in FIG. 4, according to an exemplary embodiment of the invention.

FIG. 1 shows a component 108, such as a semiconductor chip, which is to be embedded in the component carrier 100 shown in FIG. 4. In order to provide a specific function in the framework of the component carrier 100, the component 108 is covered at part of its surface area with a functional film 110 which may have an inhomogeneous thickness distribution. In the shown embodiment, only lateral side walls 112 of the component 108 are covered with the functional film 110. In contrast to this, a top main surface 114 and a bottom main surface 116 of the component 108 are exposed with respect to an environment, i.e., are not covered with the functional film 110. Said functional film 110 may be formed, for example, by sputtering, physical vapor deposition (PVD), chemical vapor deposition (CVD) and/or atomic layer deposition (ALD). Preferably, a manufacturing method for forming component 108 covered with the functional film 110 may comprise bombarding the component 108 with particles for forming the functional film 110 in a directional way to thereby achieve said inhomogeneous thickness distribution.

As already mentioned, FIG. 1 shows component 108 which is to be embedded in a stack 102 (see FIG. 2) of component carrier 100 (see FIG. 4) prior to embedding but after having formed an inhomogeneously thick functional film 110 exclusively on side surfaces of the component 108. This may, for instance, be achieved by directional sputtering or by sputtering during which the upper main surface 114 and the lower main surface 116 of the component 108 are prevented from being exposed to a sputtering beam or to sputtering particles. Furthermore, selective etching may be applied to adjust an inhomogeneous thickness distribution on the side walls 112 of the component 108, if desired. For instance, a thickness D of said functional film 110 is in a range from 100 nm to 3 μm.

Referring to FIG. 2, a laminated layer stack 102 is provided which comprises electrically conductive layer structures 104 and electrically insulating layer structures 106 (compare detail 118). Lamination may particularly denote the connection of the layer structures 104, 106 by the application of pressure and/or heat. For example, the electrically conductive layer structures 104 may comprise patterned copper foils and vertical through-connections, for example copper filled laser vias. The electrically insulating layer structures 106 may comprise a respective resin (such as a respective epoxy resin), optionally comprising reinforcing particles therein (for instance glass fibers or glass spheres). For instance, the electrically insulating layer structures 106 may be made of prepreg or FR4.

A through-hole is formed in the stack 100, for instance by mechanically cutting. A temporary carrier 120 (shown as a double-layer in FIG. 2), such as a sticky tape, is connected to a bottom side of the stack 102 to close the through hole, thereby forming a cavity 122. Subsequently, the component 108 is accommodated in the cavity 122 so as to embedded in the stack 102.

In order to obtain the structure shown in FIG. 2, the component 108 with already formed functional film 110 with inhomogeneous thickness distribution may be placed on the temporary carrier 120 attached to a lower main surface of the stack 102 provided with the central through-hole. By closing the central through-hole of the stack 102 from a bottom side, cavity 122 is defined, in which the component 108 with inhomogeneously thick functional film 110 may be accommodated. For instance, the stack 102 shown in FIG. 2 may be made of FR4 material and copper as shown in detail 118 or may be a fully cured core.

In order to obtain the structure shown in FIG. 3, one or more further electrically conductive layer structures 104 and/or one or more electrically insulating layer structures 106 may be laminated on top of the structure shown in FIG. 2. Lamination may be accomplished by the supply of heat and/or pressure. By taking this measure, the component 108 may be glued in place within its cavity 122 formed in the stack 102, since dielectric laminate may also flow in empty gaps of the cavity 122 during lamination. As a result of this lamination from the top side, the component 108 is immobilized within the stack 102. Thus, the temporary carrier 120 may then be removed since it is no more needed for stabilizing.

Additionally or alternatively to the described lamination, it is also possible to glue or fix the component 108 in space within the cavity 122 by supplying liquid adhesive material into the cavity 122 and to cure said adhesive material (compare reference sign 124 in FIG. 4).

FIG. 4 illustrates a cross-sectional view of component carrier 100 according to an exemplary embodiment of the invention.

In order to obtain the component carrier 100, a remaining gap of the cavity 122 after accommodating component 108 in the cavity 122 may be filled with adhesive material 124, as already described.

Furthermore, an electrically conductive layer structure 104 may be patterned on top of stack 102 for electrically contacting the embedded component 108 from an exterior side of the component carrier 100. As a result, laminate-type component carrier 100 is obtained which may be configured as a plate-shaped PCB (printed circuit board) or IC (integrated circuit) substrate.

The component carrier 100 comprises the stack 102 composed of the electrically conductive layer structures 104 and the electrically insulating layer structures 106. Component 108 is embedded in the cavity 122 of the stack 102. The functional film 110 covers part of the component 108 only and has an inhomogeneous thickness distribution. More specifically, said functional film 110 is applied only on side walls 112 of the component 108. An inhomogeneity of the functional film 110 on the surface of the component 108 may for instance vary by 30% between a largest thickness and a smallest thickness.

In one embodiment, said functional film 110 is made of a metal such as copper. In another embodiment, said functional film 110 is made of a resin or any kind of polymer. Also, a combination of both metallic and dielectric materials is possible for creating the functional film 110.

Said functional film 110 may be configured for providing the component carrier 100 with at least one functionality. The following functionalities are possible:

said functional layer may be configured for promoting adhesion between the component 108 and the stack 102;
said functional film 110 may be configured for providing a fatigue protection to the component 108, in particular for suppressing or buffering stress acting on the embedded component 108;
said functional film 110 may be configured for reducing a coefficient of thermal expansion mismatch between the component 108 and the stack 102;
said functional film 110 may be configured for distributing or balancing stress within the component carrier 100;
said functional film 110 may be configured for removing heat and/or spreading heat of component 108;
said functional film 110 may be configured for shielding electromagnetic radiation between the component 108 and an exterior of the component carrier 100;
said functional film 110 may be configured for reducing loss of electric and electromagnetic high-frequency signals propagating in, on and around the component carrier 100.

The component carrier 100 may be obtained after removal of the temporary carrier 120 (such as a sticky tape) from the lower main surface (for instance, by stripping or pealing it off) is shown in FIG. 4. After this process, it is possible to laminate further electrically insulating layer structures 106 and/or further electrically conductive layer structures 104 on the top side and/or on the bottom side of the obtained structure. According to FIG. 4, additional layer structures 104, 106 are formed on the top side. They are patterned to form electrically conductive contacts for contacting the embedded component 108. After that, a further buildup may follow, i.e., further lamination processes on the top side and/or on the bottom side of the component carrier 100 (not shown). In view of its inhomogeneous thickness distribution on the surface of the component 108, the functional film 110 provides a spatially well-defined defined function in the framework of the component carrier 100.

Figure 5:
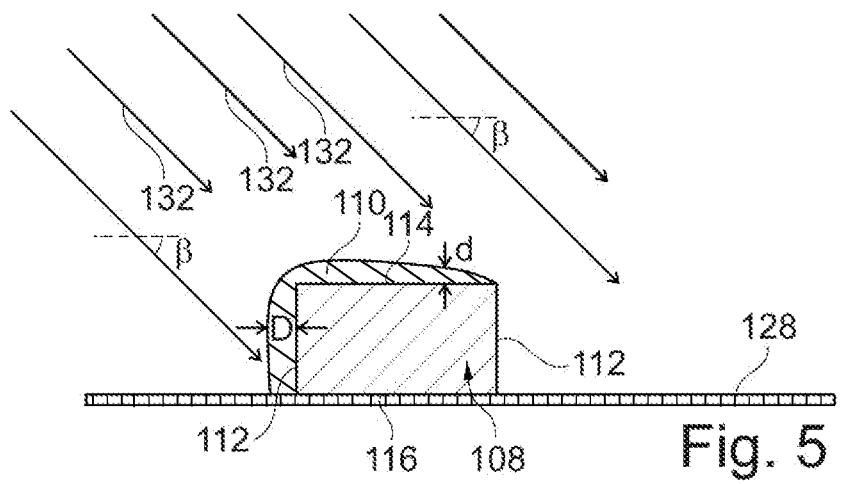
FIG. 5 shows how a directional formation of an inhomogeneously thick functional film can be obtained by directional sputtering according to an exemplary embodiment of the invention.

FIG. 5 shows how a directed formation of the inhomogeneously thick functional film 110 can be achieved by directional sputtering. According to FIG. 5, the functional film 110 has a gradually and continuously varying inhomogeneous thickness distribution over only part of the surface of the component 108. Directional sputtering means that sputtering particles 132 are supplied to the component 108 at a slanting acute angle β. In other words, said particles 132 are supplied to the component 108 at a slanted angle β of for example 30°, i.e., slanted with respect to an upper main surface 114 of the component 108. The sputter particles 132 are thus directed in a slanted way onto the upper main surface of a component 108, which is to be subsequently embedded in a stack 102. During sputtering, the component 108 is positioned on a support functioning as a protection structure 128. More generally, the described method comprises covering part of a surface of the component 108 by the protection structure 128 during the coating for disabling formation of the functional film 110 on the covered (here lower) surface of the component 108. Surface portions of the component 108 on the supporting protection structure 128, as well as those surface portions of the component 108 shadowed with respect to the slanted sputtering particles 132 provided during sputtering will remain uncovered or will be covered by a thin layer of the functional film 110 only. The result of the described procedure is the formation of a functional film 110 with an inhomogeneous thickness distribution with different (D>d) thickness values D, d on different surface portions of the component 108.

Figure 6:
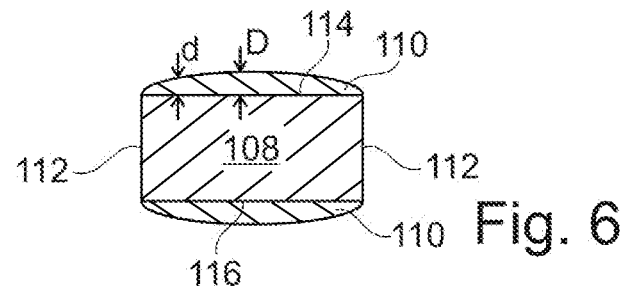
FIG. 6 shows a functional film with inhomogeneous thickness distribution applied only to an upper and a lower main surface of a component to be embedded in a stack according to an exemplary embodiment of the invention.

As can be taken from FIG. 6, it is also possible that the functional film 110 with inhomogeneous thickness distribution is applied only to an upper main surface 114 and to a lower main surface 116 of the component 108 to be embedded in the stack 102, wherein the side walls 112 of the component 108 may remain exposed and free of the functional film 110. In FIG. 6, the functional film 110 has a gradually and continuously varying inhomogeneous thickness distribution over the main surfaces 114, 116 of the component 108. This may, for instance, be advantageous for improving lamination. It has turned out that in particular the two opposing horizontal main surfaces 114, 116 of a component 108 to be embedded in a component carrier 100 have a high impact on adhesion so that a selective coverage of the horizontal main surfaces 114, 116 with an adhesion promoting functional film 110 may be of utmost advantage. For instance, the component 108 illustrated in FIG. 6 may be manufactured by covering the side walls 112 during sputtering with a protection tape or the like so that they remain unexposed to material of the functional film 110 after removing the temporary protection tape (not shown). FIG. 6 shows an inhomogeneous thickness distribution of the functional film 110 on a respective horizontal main surface 114, 116 of the component 108. More specifically, the functional film 110, in the shown example, has its largest thickness, D, in the central portion of the respective main surface 114, 116. This largest thickness, D, may be larger than a thickness, d, at each other position of respective main surface 114, 116. The inhomogeneous thickness distribution of the functional film 110 gradually decreases from the respective center of the respective horizontal main surface 114, 116 towards the side walls 112.

Figure 7:
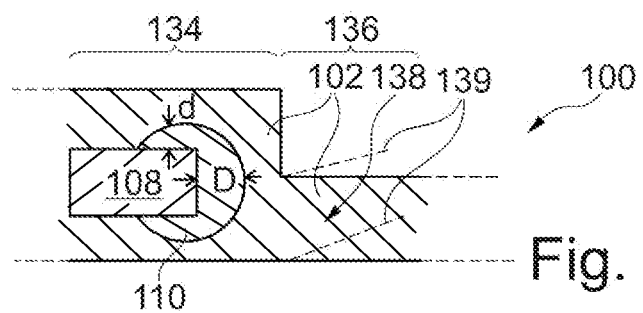
FIG. 7 shows a component in a component carrier according to another exemplary embodiment of the invention covered with a functional film on one surface portion thereof, which has locally thickened and locally thinned sub-portions for spatially selective mechanical buffering.

As can be taken from FIG. 7, a component 108 in a component carrier 100 according to another exemplary embodiment of the invention may be covered with a functional film 110 on one surface portion thereof, which has locally thicker and locally thinner portions for a spatially selective mechanical buffering. For instance, the locally thicker portions of the functional film 110 may be located and provided specifically where the component carrier 100 suffers from excessive load during operation, for instance bending stress in case of a partially flexible and partially rigid component carrier 100. More specifically, FIG. 7 shows an interface between a rigid portion 134 and a flexible portion 136 of a partially flexible and partially rigid component carrier 100 (for instance a rigid-flex component carrier or a semi-flex component carrier). At the position indicated with reference sign 138, maximum bending stress may occur during bending (see reference sign 139) the flexible portion 136 with respect to the rigid portion 134. A component 108 is embedded in the component carrier 100 relatively close to the bending position 138. A portion of the component 108 being closest to the critical position 138 may be protected against delamination, crack formation and excessive mechanical load during bending by selectively coating only a sub-portion of the component 108 being closest to critical section 138 with a functional film 110 having an inhomogeneous thickness distribution. In other words, a maximum thickness, D, of the functional film 110 may be present where the component 108 is located closest to the critical bending position 138, whereas the thickness, d, of the functional film 110 gradually decreases at surface portions of the component 108 being further away from the critical bending position 138. In the shown embodiment, the functional film 110 may be a mechanical buffer for buffering stress, for instance a soft polymer.

Figure 8:
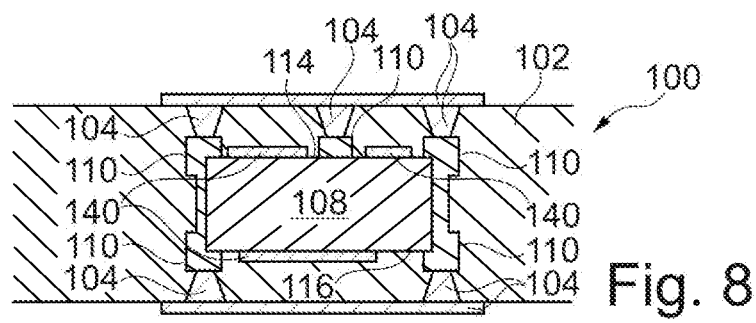
FIG. 8 shows a component in a component carrier according to another exemplary embodiment of the invention covered with a functional film on a partial surface portion thereof, wherein the functional film has locally thickened and locally thinned portions for spatially selective heat removal.

As can be taken from FIG. 8, a component 108 of a component carrier 100 according to another exemplary embodiment of the invention may be covered with a functional film 110 only on specific surface portions thereof. A sequence of locally thickened and locally thinned portions of the functional system 110 are shown which are configured for promoting heat removal. According to FIG. 8, the illustrated functional film 110 has a stepped and discontinuous inhomogeneous thickness distribution with multiple separate island-type structures distributed over part of the surface of the component 108. In the embodiment of FIG. 8, excessive thermal load may occur during operation of the component carrier 100 due to local hot spots (for instance, close to a pad 140 of a power semiconductor chip as an example for a component 108, at which pads 140 excessive heat is created during operation). For instance, the functional film 110 may be made of a thermally highly conductive material, such as copper, a ceramic, graphene, etc.

For instance, the discontinuous islands forming the functional film 110 according to FIG. 8 may be formed by firstly continuously covering the entire component 108 with functional material of homogeneous thickness followed by a selective removal of parts of the functional material by a patterning to thereby create the inhomogeneous thickness distribution shown in FIG. 8.

Figure 9:
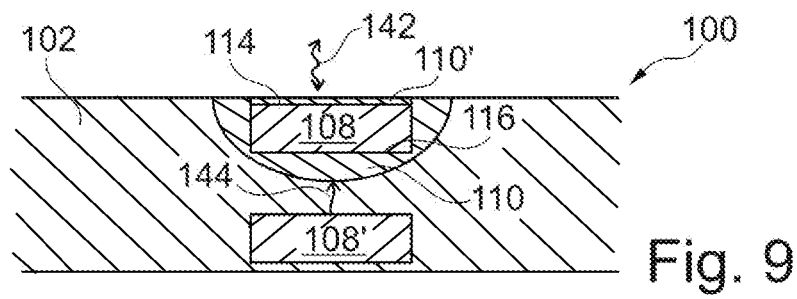
FIG. 9 shows a component in a component carrier according to another exemplary embodiment of the invention covered with a functional film on only one surface portion thereof, wherein the functional film has locally thickened and locally thinned portions for spatially selective electromagnetic shielding.

FIG. 9 shows a component 108 in a component carrier 100 according to another exemplary embodiment of the invention covered with a functional film 110 on one surface portion thereof, which has locally thicker and locally thinner portions for spatially selective electromagnetic shielding.

In the shown embodiment, embedded component 108 may be a high frequency semiconductor chip with an antenna, for instance for Bluetooth applications. Another high-frequency component 108' is also embedded in stack 102 of component carrier 100. By covering only a portion of the surface of component 108 with an electromagnetic radiation absorbing functional film 110 which faces the other high-frequency component 108', electromagnetic radiation 142 may freely propagate between the component 108 and an environment of the component carrier 100. At the same time, the selective coverage of the component 108 with functional film 110 may protect component 108 from electromagnetic radiation 144 propagating from the other component 108'. An inhomogeneous thickness distribution of the functional film 110 is highly advantageous for the described functionality.

Advantageously, the component carrier 100 according to a FIG. 9 comprises a further functional film 110' covering another surface portion of the component 108 than the previously described functional film 110. While said functional film 110 shields electromagnetic radiation, said further functional film 110' provides a low loss function in terms of high-frequency technology. The further functional film 110' may thus be made of a low loss material having low loss for high frequencies, for instance a loss factor or dissipation factor of not more than 0.004 at a frequency of 1 GHz. As shown, the further functional film 110' is exposed to electromagnetic radiation 142, or a corresponding electric high-frequency signal.

It should be noted that the term "comprising" does not exclude other elements or steps and the articles "a" or "an" does not exclude a plurality. Also, elements described in association with different embodiments may be combined.

Implementation of the invention is not limited to the preferred embodiments shown in the figures and described above. Instead, a multiplicity of variants is possible which variants use the solutions shown and the principle according to the invention even in the case of fundamentally different embodiments.

The invention claimed is:

1. A component carrier, comprising:
a stack comprising at least one electrically conductive layer structure and/or at least one electrically insulating layer structure;
a component embedded in the stack; and
a functional film covering at least part of the component and having an inhomogeneous thickness distribution over at least part of a surface of the component;
wherein the functional film has a gradually or continuously varying inhomogeneous thickness distribution over a central portion of the surface of the component, wherein the thickness of said functional film is in a range from 50 nm to 5 µm.

2. The component carrier according to claim 1, wherein said functional film comprises or consists of at least one of the group consisting of a metal, a metal alloy, and a ceramic.

3. The component carrier according to claim 1, wherein said functional film comprises or consists of one of the group consisting of a resin and a polymer.

4. The component carrier according to claim 1, wherein said thickness distribution of said functional film is in a range from 50 nm to 3 µm.

5. The component carrier according to claim 1, wherein a ratio between a difference between a largest thickness and a smallest thickness of the functional film and the largest thickness is at least 10%.

6. The component carrier according to claim 1, wherein said functional film is configured for providing the component carrier with at least one functionality which is spatially fine-tuned by said inhomogeneous thickness distribution.

7. The component carrier according to claim 1, wherein said functional film is configured for promoting adhesion between the component and the stack.

8. The component carrier according to claim 1, wherein said functional film is configured for providing a fatigue protection to the component.

9. The component carrier according to claim 1, wherein the inhomogeneous thickness distribution is asymmetric on at least one of a top surface of the component and a bottom surface of the component.

10. The component carrier according to claim 1, further comprising at least one of the following features:
    wherein said functional film is configured for reducing a coefficient of thermal expansion mismatch between the component and the stack;
    wherein said functional film is configured for distributing stress within the component carrier;
    wherein said functional film is configured for removing heat and/or spreading heat created by the component during operation;
    wherein said functional film is configured for shielding electromagnetic radiation from propagating between the component and an exterior of the component carrier.

11. The component carrier according to claim 1, further comprising at least one of the following features:
    wherein the at least one electrically conductive layer structure comprises at least one of the group consisting of copper, aluminum, nickel, silver, gold, palladium, and tungsten;
    wherein the at least one electrically insulating layer structure comprises at least one of the group consisting of reinforced or non-reinforced resin, epoxy resin or Bismaleimide-Triazine resin, FR-4, FR-5, cyanate ester, polyphenylene derivate, glass, prepreg material, polyimide, polyamide, liquid crystal polymer, epoxy-based build-up material, polytetrafluoroethylene, a ceramic, and a metal oxide;
    wherein the component carrier is shaped as a plate;
    wherein the component carrier is configured as one of the group consisting of a printed circuit board, and a substrate.

12. The component carrier according to claim 1, wherein the functional film has a fixed continuously varying inhomogeneous thickness distribution before the functional film and component are embedded in the stack.

13. A component carrier, comprising:
    a stack comprising at least one electrically conductive layer structure and at least one electrically insulating layer structure;
    a component embedded in the stack; and
    a functional film covering at least part of the component and having an inhomogeneous thickness distribution over at least part of a surface of the component;
    wherein the functional film has a gradually or continuously varying inhomogeneous thickness distribution over a central portion of the surface of the component, wherein a largest thickness of the inhomogeneous distribution is outside a center of a top surface of the component.

14. A component carrier, comprising:
    a stack comprising at least one electrically conductive layer structure and at least one electrically insulating layer structure;
    a component embedded in the stack; and
    a functional film covering at least part of the component and having an inhomogeneous thickness distribution over at least part of a surface of the component;
    wherein the functional film has a gradually or continuously varying inhomogeneous thickness distribution over a central portion of the surface of the component,
    wherein the inhomogeneous thickness distribution extends from at least one sidewall of the component to the top surface of the component, the inhomogeneous thickness distribution having a largest thickness next to an edge of the component.

15. A component carrier, comprising:
    a stack comprising at least one electrically conductive layer structure and at least one electrically insulating layer structure;
    a component embedded in the stack; and
    a functional film covering at least part of the component and having an inhomogeneous thickness distribution over at least part of a surface of the component;
    wherein the functional film has a gradually or continuously varying inhomogeneous thickness distribution over a central portion of the surface of the component, wherein a center of gravity of the inhomogeneous thickness distribution is located outside a central axis of the component.

16. A method of manufacturing a component carrier, the method comprising:
    embedding a component in a stack comprising at least one electrically conductive layer structure and/or at least one electrically insulating layer structure; and
    coating at least part of a surface of the component with a functional film having an inhomogeneous thickness distribution,
    wherein the functional film has a gradually or continuously varying inhomogeneous thickness distribution over a central portion of the surface of the component,
    wherein the thickness of said functional film is in a range from 50 nm to 5 µm.

17. The method according to claim 16, further comprising at least one of the following features:
    wherein the method comprises forming said functional film by at least one of the group consisting of physical vapor deposition, chemical vapor deposition, atomic layer deposition, and plasma spraying;
    wherein the method comprises bombarding the component with particles for forming the functional film in a directional way by supplying said particles at a slanted acute angle with respect to main surfaces of the component, to thereby form said inhomogeneous thickness distribution;
    wherein the method comprises covering at least part of a surface of the component by a protection structure during the coating for disabling formation of the functional film on the surface of the component covered by the protection structure;
    wherein the method comprises removing by patterning part of the functional film from part of a surface of the component to thereby create the inhomogeneous thickness distribution;

wherein the method comprises coating the component outside of the stack or after insertion of the component in the stack.

\* \* \* \* \*